(12) United States Patent
Lee et al.

(10) Patent No.: US 12,206,415 B2
(45) Date of Patent: Jan. 21, 2025

(54) ELECTRONIC DEVICE AND ELECTRONIC SYSTEM FOR GENERATING AN OPERATION VOLTAGE

(71) Applicant: SK hynix Inc., Icheon-si (KR)

(72) Inventors: Dong Beom Lee, Icheon-si (KR); Hyeong Soo Jeong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 321 days.

(21) Appl. No.: 17/536,206

(22) Filed: Nov. 29, 2021

(65) Prior Publication Data
US 2023/0076494 A1 Mar. 9, 2023

(30) Foreign Application Priority Data
Sep. 8, 2021 (KR) .................. 10-2021-0120019

(51) Int. Cl.
*H03K 3/03* (2006.01)
*G06F 3/06* (2006.01)
(52) U.S. Cl.
CPC .......... *H03K 3/0315* (2013.01); *G06F 3/0614* (2013.01); *G06F 3/0658* (2013.01); *G06F 3/0673* (2013.01)
(58) Field of Classification Search
CPC ... H03K 3/0315; G06F 3/0614; G06F 3/0658; G06F 3/0673
See application file for complete search history.

(56) References Cited

U.S. PATENT DOCUMENTS

| | | | | |
|---|---|---|---|---|
| 9,490,022 | B2* | 11/2016 | Lin | G11C 5/144 |
| 10,108,491 | B2* | 10/2018 | Choi | G06F 3/061 |
| 11,227,664 | B2* | 1/2022 | Cho | G11C 16/10 |
| 2007/0165470 | A1* | 7/2007 | Cho | G11C 29/12005 365/201 |
| 2008/0117705 | A1* | 5/2008 | Jeon | G11C 29/021 365/225.7 |
| 2010/0090750 | A1* | 4/2010 | Kim | G11C 29/021 327/525 |
| 2013/0159798 | A1* | 6/2013 | Yang | G11C 29/026 714/E11.159 |
| 2013/0249611 | A1 | 9/2013 | Vandepas | |
| 2015/0310939 | A1* | 10/2015 | Cho | G11C 17/16 365/96 |

FOREIGN PATENT DOCUMENTS

KR 1020080044444 A 5/2008

* cited by examiner

*Primary Examiner* — Thomas D Alunkal
(74) *Attorney, Agent, or Firm* — WILLIAM PARK & ASSOCIATES LTD.

(57) ABSTRACT

An electronic device may include: a control pulse generation circuit configured to selectively generate one of a first control pulse and a second control pulse on the basis of a reference code during a test period; and a voltage control code generation circuit configured to perform an addition operation or subtraction operation on a logic bit set of a voltage control code to set the voltage level of an operation voltage on the basis of the first and second control pulses.

18 Claims, 13 Drawing Sheets

ELECTRONIC DEVICE AND ELECTRONIC SYSTEM FOR GENERATING AN OPERATION VOLTAGE

CROSS-REFERENCES TO RELATED APPLICATIONS

The present application claims priority under 35 U.S.C 119(a) to Korean Application No. 10-2021-0120019, filed on Sep. 8, 2021, in the Korean intellectual property Office, which is incorporated herein by reference in its entirety set forth in full.

BACKGROUND

1. Technical Field

Examples of embodiments of the present disclosure generally relate to an electronic device and an electronic system configured to set an operation voltage to a target level.

2. Related Art

An electronic device performs various internal operations. For example, the electronic device may perform various internal operations such as a data input/output operation, a sensing operation, a calculation operation and a control operation. The electronic device may generate an operation voltage set to a voltage level required for performing an internal operation. Hereafter, the voltage level will be referred to as 'target level'. Since the voltage level of the operation voltage generated by the electronic device may be different from the target level, the voltage level of the operation voltage needs to be set to the target level through a test.

SUMMARY

In an embodiment, an electronic device may include: a control pulse generation circuit configured to selectively generate one of a first control pulse and a second control pulse on the basis of a reference code during a test period; and a voltage control code generation circuit configured to perform at least one of an addition operation and a subtraction operation on a logic bit set of a voltage control code to set the voltage level of an operation voltage on the basis of the first and second control pulses.

In another embodiment, an electronic system may include: a control device configured to generate a command and a reference code; and an electronic device configured to generate a test command for a test on the basis of the command, and perform at least one of an addition operation and a subtraction operation on a logic bit set of a voltage control code to set the voltage level of an operation voltage on the basis of the reference code during a test period in which the test is performed.

In another embodiment, an electronic system may include: a control device configured to generate a command; and an electronic device configured to generate a test command for a test on the basis of the command, store a reference code in the electronic device, and perform at least one of an addition operation and a subtraction operation on a logic bit set of a voltage control code to set the voltage level of an operation voltage on the basis of the reference code during a test period in which the test is performed.

DETAILED DESCRIPTION

Figure 1:
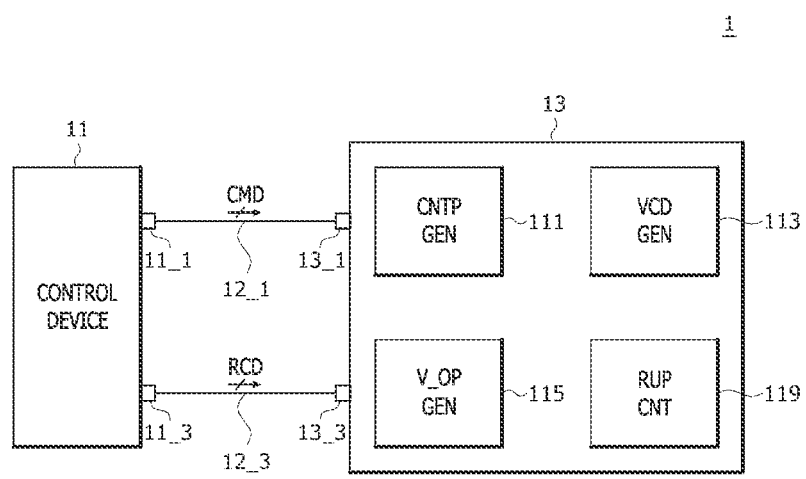
FIG. 1 is a block diagram illustrating a configuration of an electronic system in accordance with an embodiment.

In the descriptions of the following embodiments, the term "preset" indicates that the value of a parameter is previously decided, when the parameter is used in a process or algorithm. According to an embodiment, the value of the parameter may be set when the process or algorithm is started or while the process or algorithm is performed.

The terms such as "first" and "second", which are used to distinguish among various components, are not limited by the components. For example, a first component may be referred to as a second component, and vice versa.

When one component is referred to as being "coupled" or "connected" to another component, it may indicate that the components are directly coupled or connected to each other or coupled or connected to each other through another component interposed therebetween. On the other hand, when one component is referred to as being "directly coupled" or "directly connected" to another component, it may indicate that the components are directly coupled or connected to each other without another component interposed therebetween.

"Logic high level" and "logic low level" are used to describe the logic levels of signals. A signal having "logic high level" is distinguished from a signal having "logic low level". For example, when a signal having a first voltage corresponds to "logic high level", a signal having a second voltage may correspond to "logic low level". According to an embodiment, "logic high level" may be set to a voltage higher than "logic low level". According to an embodiment, the logic levels of signals may be set to different logic levels or opposite logic levels. For example, a signal having a logic high level may be set to have a logic low level according to an embodiment, and a signal having a logic low level may be set to have a logic high level according to an embodiment.

"Logic bit set" may indicate a combination of logic levels of bits contained in a signal. When the logic levels of the bits contained in the signal are changed, the logic bit set of the signal may be differently set. For example, when two bits are contained in a signal, the logic bit set of the signal may be set to a first logic bit set, in case that the logic levels of the two bits contained in the signal are "logic low level, logic low level", and the logic bit set of the signal may be set to a second logic bit set, in case that the logic levels of the two bits contained in the signal are "logic low level, logic high level".

Hereafter, embodiments will be described. The embodiments are only used for examples of the present disclosure, and the scope of the present disclosure is not limited by the embodiments.

An embodiment of the present disclosure relates to an electronic device and an electronic system which can set an operation voltage to a target level.

In accordance with an embodiment, the electronic device and the electronic system may generate a voltage control code having a logic bit set that is controlled on the basis of a comparison result between an oscillating code generated during a test period and a reference code generated in response to a target level, and repeatedly perform a test of controlling the voltage level of an operation voltage on the basis of the target level according to the voltage control code, thereby setting the operation voltage to the target level.

In accordance with an embodiment, the electronic device and the electronic system may perform a rupture operation of storing the voltage control code generated on the basis of the comparison result between the oscillating code and the reference code, and may check the level of the operation voltage by checking the stored voltage control code.

In accordance with an embodiment, the plurality of electronic devices using the operation voltage perform a test of controlling the voltage level of the operation voltage on the basis of the target level, thereby minimizing the differences in voltage level among the operation voltages generated by the plurality of electronic devices.

In accordance with an embodiment, the electronic device and the electronic system might not repeatedly receive a reference code in each test, but repeatedly perform the test of controlling the level of the operation voltage, thereby reducing the test time.

FIG. 1 is a block diagram illustrating a configuration of an electronic system 1 in accordance with an embodiment. As illustrated in FIG. 1, the electronic system 1 may include a control device 11 and an electronic device 13.

The control device 11 may include a first control pin 11_1 and a second control pin 11_3. The electronic device 13 may include a first device pin 13_1 and a second device pin 13_3. The control device 11 may transmit a command CMD to the electronic device 13 through a first transmission line 12_1 coupled between the first control pin 11_1 and the first device pin 13_1. The first control pin 11_1, the first transmission lines 12_1 and the first device pin 13_1 may be each implemented as a plurality of pins or lines according to the number of bits contained in the command CMD. In an embodiment, a control pulse generation circuit 111 (See FIG. 2) may receive a reference code RCD externally from the electronic device. For example, the control device 11 may transmit a reference code RCD to the electronic device 13 through a second transmission line 12_3 coupled between the second control pin 11_3 and the second device pin 13_3. The reference code RCD may be set to a logic bit set corresponding to the target level of an operation voltage (V_OP of FIG. 2). The control device 11 may be implemented as a test device, memory controller or the like. The control device 11 may apply the command CMD and the reference code RCD to the electronic device 13 and control the electronic device 13 to perform a test for setting the voltage level of the operation voltage V_OP to the target level.

The electronic device 13 may receive the command CMD and the reference code RCD from the control device 11, and perform the test for setting the voltage level of the operation voltage V_OP to the target level. The electronic device 13 may include a control pulse generation circuit 111 configured to generate one of a first control pulse (CNTP1 of FIG. 2) and a second control pulse (CNTP2 of FIG. 2) according to a comparison result between an oscillating code (OSC_CD of FIG. 3) and the reference code RCD during a test period. The electronic device 13 may include a voltage control code generation circuit 113 configured to control a logic bit set of a voltage control code (VCD of FIG. 2) by performing addition or subtraction on the voltage control code VCD on the basis of the first control pulse CNTP1 and the second control pulse CNTP2. The electronic device 13 may include an operation voltage generation circuit 115 configured to drive the operation voltage V_OP to a voltage level corresponding to the logic bit set of the voltage control code VCD. The electronic device 13 may include a rupture control circuit 119 configured to perform a rupture operation of storing the voltage control code VCD when the rupture command RCMD is generated.

Figure 2:
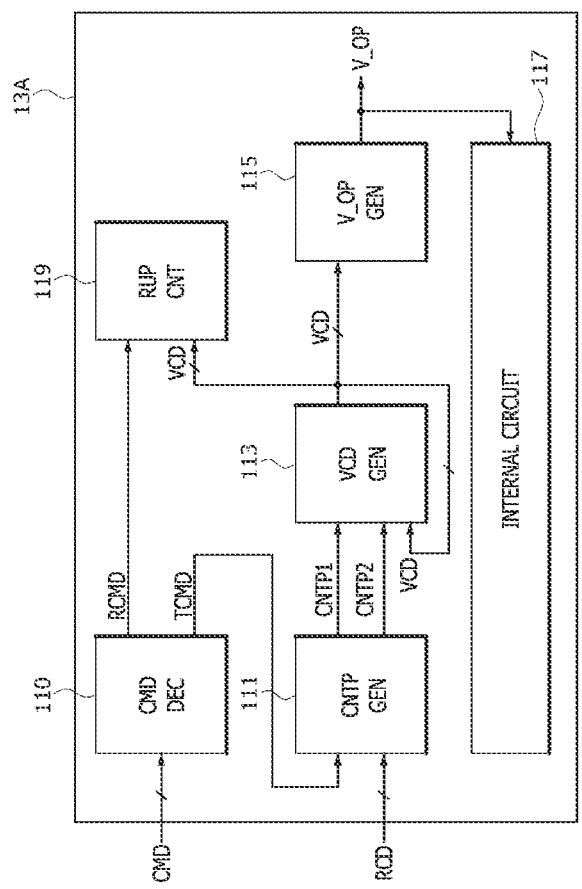
FIG. 2 is a block diagram illustrating a configuration of an electronic device included in the electronic system in accordance with the present embodiment.

FIG. 2 is a block diagram illustrating a configuration of an electronic device 13A in accordance with an example of the electronic device 13. As illustrated in FIG. 2, the electronic device 13A may include a command decoder (CMD DEC) 110, a control pulse generation circuit (CNTP GEN) 111, a voltage control code generation circuit (VCD GEN) 113, an operation voltage generation circuit (V_OP GEN) 115, an internal circuit 117 and a rupture control circuit (RUP CNT) 119.

The command decoder 110 may receive the command CMD from the control device (11 of FIG. 1). The command decoder 110 may generate a test command TCMD and a rupture command RCMD on the basis of the command CMD. The command decoder 110 may decode the command CMD to generate the test command TCMD which is used to perform a test of setting the voltage level of the operation voltage V_OP to the target level. The command decoder 110 may generate the rupture command RCMD for a rupture operation of storing the voltage control code VCD generated as the test result. The command CMD may include a plurality of bits. The logic bit set of the command CMD when the test command TCMD is generated and the logic bit set of the command CMD when the rupture command RCMD is generated may be differently set.

The control pulse generation circuit 111 may receive the reference code RCD from the control device 11. The control pulse generation circuit 111 may be connected to the command decoder 110, and receive the test command TCMD from the command decoder 110. The control pulse generation circuit 111 may generate the first control pulse CNTP1 and the second control pulse CNTP2 on the basis of the test command TCMD and the reference code RCD. The control pulse generation circuit 111 may generate an oscillating code (OSC_CD of FIG. 3) by counting an oscillating signal (OSC of FIG. 3) which is generated on the basis of the test command TCMD during a test period, and generate one of the first and second control pulses CNTP1 and CNTP2 according to a comparison result between the oscillating code OSC_CD and the reference code RCD. For example, the control pulse generation circuit 111 may generate the first control pulse CNTP1 when the oscillating code OSC_CD is set to a value larger than the reference code RCD, and generate the second control pulse CNTP2 when the oscillating code OSC_CD is set to a value equal to or smaller than the reference code RCD. The reference code RCD may be set to a logic bit set corresponding to the target level.

The voltage control code generation circuit 113 may be coupled to the control pulse generation circuit 111, and receive the first and second control pulses CNTP1 and CNTP2 from the control pulse generation circuit 111. The voltage control code generation circuit 113 may control the logic bit set of the voltage control code VCD by performing addition or subtraction on the voltage control code VCD on the basis of the first and second control pulses CNTP1 and CNTP2. For example, when the first control pulse CNTP1 is generated with the logic bit set of the voltage control code VCD set to '100', the voltage control code generation circuit 113 may generate the voltage control code VCD having a logic bit set of '101' by adding one bit to the voltage control code VCD. For another example, when the second control pulse CNTP2 is generated with the logic bit set of the voltage control code VCD set to '100', the voltage control code generation circuit 113 may generate the voltage control code VCD having a logic bit set of '011' by subtracting one bit from the voltage control code VCD. In an embodiment, the voltage control code VCD may be implemented to include various numbers of bits. In an embodiment, two or more bits may be added to the voltage control code VCD according to the first control pulse CNTP1, or subtracted from the voltage control code VCD according to the second control pulse CNTP2.

The operation voltage generation circuit 115 may be coupled to the voltage control code generation circuit 113, and receive the voltage control code VCD from the voltage control code generation circuit 113. The operation voltage generation circuit 115 may drive the operation voltage V_OP to a voltage level corresponding to the logic bit set of the voltage control code VCD. For example, the operation voltage generation circuit 115 may generate the operation voltage V_OP having a voltage level that rises as the logic bit set of the voltage control code VCD increases, but the present embodiment is not limited thereto. For another example, the operation voltage generation circuit 115 may generate the operation voltage V_OP having a voltage level that falls as the logic bit set of the voltage control code VCD decreases, but the present embodiment is not limited thereto.

The internal circuit 117 may be coupled to the operation voltage generation circuit 115, and receive the operation voltage V_OP from the operation voltage generation circuit 115. The internal circuit 117 may receive the operation voltage V_OP having a voltage level that is controlled on the basis of the reference code RCD, and perform various internal operations. The operation voltage V_OP may be controlled to the target level corresponding to the reference code RCD, as tests are repeated.

The rupture control circuit 119 may be coupled to the command decoder 110 and the voltage control code generation circuit 113, receive the rupture command RCMD from the command decoder 110, and receive the voltage control code VCD from the voltage control code generation circuit 113. The rupture control circuit 119 may perform a rupture operation of storing the voltage control code VCD when the rupture command RCMD is generated. In an embodiment, the control device 11 may receive the voltage control code VCD, check the voltage level of the operation voltage V_OP generated by the electronic device 13A, and control the target level.

Figure 3:
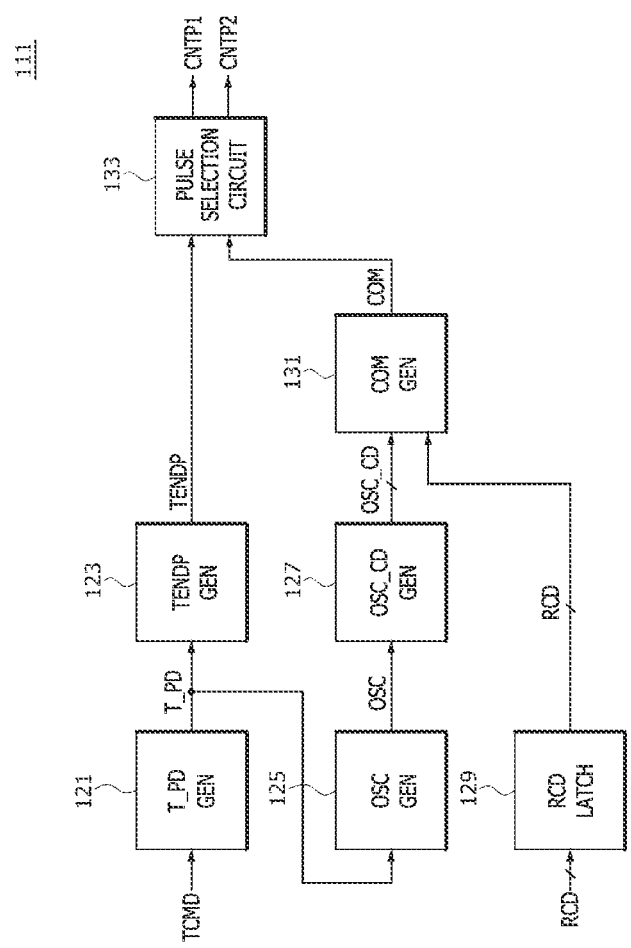
FIG. 3 is a block diagram illustrating a configuration of a control pulse generation circuit included in the electronic device in accordance with the present embodiment.

FIG. 3 is a block diagram illustrating a configuration of the control pulse generation circuit 111 in accordance with the present embodiment. As illustrated in FIG. 3, the control pulse generation circuit 111 may include a test period signal generation circuit (T_PD GEN) 121, a test end pulse generation circuit (TENDP GEN) 123, an oscillating signal generation circuit (OSC GEN) 125, an oscillating code generating circuit (OSC_CD GEN) 127, a reference code latch (RCD LATCH) 129, a comparison signal generation circuit (COM GEN) 131 and a pulse selection circuit 133.

The test period signal generation circuit 121 may generate a test period signal T_PD on the basis of the test command TCMD. The test period signal generation circuit 121 may generate the test period signal T_PD which is enabled during a preset test period, when the test command TCMD is generated. The preset test period may be set in various manners depending on embodiments.

The test end pulse generation circuit 123 may be coupled to the test period signal generation circuit 121, and receive the test period signal T_PD from the test period signal generation circuit 121. The test end pulse generation circuit 123 may generate a test end pulse TENDP on the basis of the test period signal T_PD. The test end pulse generation circuit 123 may generate the test end pulse TENDP when the test period signal T_PD is disabled after a test is ended. In an embodiment, the test end pulse generation circuit 123 may generate the test end pulse TENDP at a point of time that a preset delay period has elapsed from a point of time that the test period signal T_PD was disabled after a test was ended.

The oscillating signal generation circuit 125 may be coupled to the test period signal generation circuit 121, and receive the test period signal T_PD from the test period signal generation circuit 121. The oscillating signal generation circuit 125 may generate the oscillating signal OSC on the basis of the test period signal T_PD. The oscillating signal generation circuit 125 may generate the oscillating signal OSC during the test period in which the test period signal T_PD is enabled. The oscillating signal generation circuit 125 may be implemented as an ROD (Ring Oscillator Delay) circuit, and generate the oscillating signal OSC as a period signal.

The oscillating code generation circuit 127 may be coupled to the oscillating signal generation circuit 125, and receive the oscillating signal OSC from the oscillating signal generation circuit 125. The oscillating code generation circuit 127 may generate the oscillating code OSC_CD on the basis of the oscillating signal OSC. The oscillating code generation circuit 127 may count the oscillating signal OSC, and generate the oscillating code OSC_CD having a logic bit set corresponding to a count value obtained by counting the oscillating signal OSC. For example, the oscillating code generation circuit 127 may generate the oscillating code OSC_CD having a logic bit set of '011' by counting the oscillating signal OSC three times, when three pulses of the oscillating signal OSC occur during a test period.

The reference code latch 129 may receive and latch the reference code RCD, and output the latched reference code RCD. The reference code RCD may be applied to the electronic device 13A from the control device 11, and set to have a logic bit set corresponding to the target level of the operation voltage V_OP.

The comparison signal generation circuit 131 may be coupled to the oscillating code generation circuit 127 and the reference code latch 129, receive the oscillating code OSC_CD from the oscillating code generation circuit 127, and receive the reference code RCD from the reference code latch 129. The comparison signal generation circuit 131 may generate a comparison signal COM on the basis of the oscillating code OSC_CD and the reference code RCD. The comparison signal generation circuit 131 may generate the comparison signal COM having a logic bit set that is set according to the comparison result between the oscillating code OSC_CD and the reference code RCD. For example, the comparison signal generation circuit 131 may generate the comparison signal COM which is set to a first logic level when the oscillating code OSC_CD is larger than the reference code RCD, and generate the comparison signal COM which is set to a second logic level when the oscillating code OSC_CD is smaller than or equal to the reference code RCD. In the present embodiment, the first logic level may be set to a logic high level, and the second logic level may be set to a logic low level. However, the present embodiment is not limited thereto.

The pulse selection circuit 133 may be coupled to the test end pulse generation circuit 123 and the comparison signal generation circuit 131, receive the test end pulse TENDP from the test end pulse generation circuit 123, and receive the comparison signal COM from the comparison signal generation circuit 131. The pulse selection circuit 133 may generate the first control pulse CNTP1 and the second control pulse CNTP2 on the basis of the test end pulse TENDP and the comparison signal COM. The pulse selection circuit 133 may selectively generate the first or second control pulse CNTP1 or CNTP2 from the test end pulse TENDP according to the logic level of the comparison signal COM. For example, when the oscillating code OSC_CD is set to a larger value than the reference code RCD such that the comparison signal COM is set to the first logic level, the pulse selection circuit 133 may generate the first control pulse CNTP1 from the test end pulse TENDP. For another example, when the oscillating code OSC_CD is set to a value smaller than or equal to the reference code RCD such that the comparison signal COM is set to the second logic level, the pulse selection circuit 133 may generate the second control pulse CNTP2 from the test end pulse TENDP.

Figure 4:
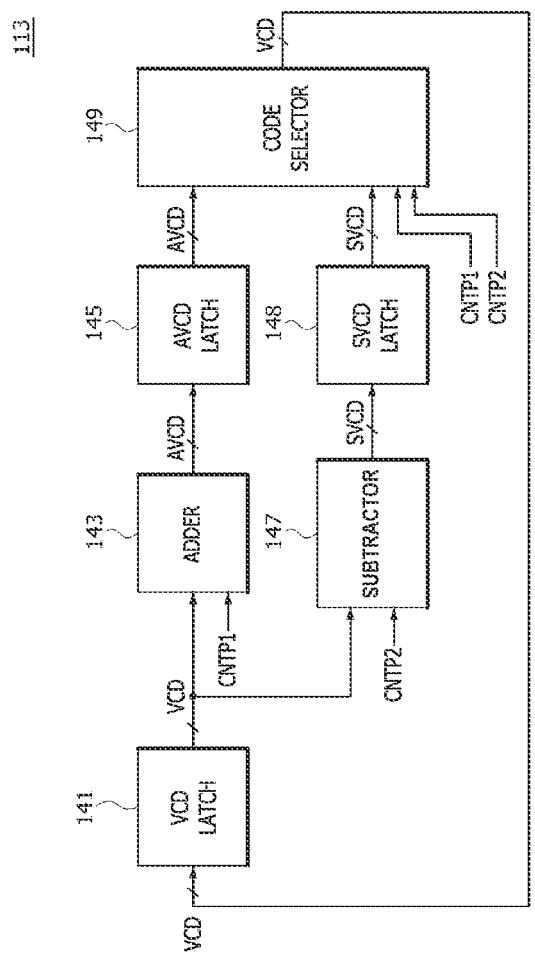
FIG. 4 is a block diagram illustrating a configuration of a voltage control code generation circuit included in the electronic device in accordance with the present embodiment.

FIG. 4 is a block diagram illustrating a configuration of the voltage control code generation circuit 113 in accordance with the present embodiment. As illustrated in FIG. 4, the voltage control code generation circuit 113 may include a voltage control code latch (VCD LATCH) 141, an adder 143, an addition code latch 145, a subtractor 147, a subtraction code latch 148 and a code selector 149.

The voltage control code latch 141 may be coupled to the code selector 149, receive the voltage control code VCD from the code selector 149, latch the received voltage control code VCD, and output the latched voltage control code VCD. The voltage control code VCD may be set to a logic bit set for setting the voltage level of the operation voltage V_OP.

The adder 143 may be coupled to the voltage control code latch 141 and the control pulse generation circuit (111 of FIG. 3), receive the voltage control code VCD from the voltage control code latch 141, and receive the first control pulse CNTP1 from the control pulse generation circuit 111. The adder 143 may generate an addition voltage control code AVCD on the basis of the first control pulse CNTP1 and the voltage control code VCD. The adder 143 may generate the addition voltage control code AVCD by performing addition on the voltage control code VCD when the first control pulse CNTP1 is generated. For example, when the first control pulse CNTP1 is generated with the logic bit set of the voltage control code VCD set to '100', the adder 143 may generate the addition voltage control code AVCD having a logic bit set of '101' by adding one bit to the voltage control code VCD. In an embodiment, the voltage control code VCD and the addition voltage control code AVCD may be implemented to include various numbers of bits. In an embodiment, the addition voltage control code AVCD may be generated by adding two bits or more to the voltage control code VCD.

The addition code latch 145 may be coupled to the adder 143, and receive the addition voltage control code AVCD from the adder 143. The addition code latch 145 may latch the addition voltage control code AVCD, and output the latched addition voltage control code AVCD.

The subtractor 147 may be coupled to the voltage control code latch 141, receive the voltage control code VCD from the voltage control code latch 141, and receive the second control pulse CNTP2 from the control pulse generation circuit (111 of FIG. 3). The subtractor 147 may generate a subtraction voltage control code SVCD on the basis of the second control pulse CNTP2 and the voltage control code VCD. The subtractor 147 may generate the subtraction voltage control code SVCD by performing subtraction on the voltage control code VCD when the second control pulse CNTP2 is generated. For example, when the second control pulse CNTP2 is generated with the logic bit set of the voltage control code VCD set to '100', the subtractor 147 may generate the subtraction voltage control code SVCD having a logic bit set of '011' by subtracting one bit from the voltage control code VCD. In an embodiment, the voltage control code VCD and the subtraction voltage control code SVCD may be each implemented to include various numbers of bits. In an embodiment, the subtraction voltage control code SVCD may be generated by subtracting two bits or more from the voltage control code VCD.

The subtraction code latch 148 may be coupled to the subtractor 147, and receive the subtraction voltage control code SVCD from the subtractor 147. The subtraction code latch 148 may latch the subtraction voltage control code SVCD, and output the latched subtraction voltage control code SVCD.

The code selector 149 may be coupled to the addition code latch 145, receive the addition voltage control code AVCD from the addition code latch 145, receive the subtraction voltage control code SVCD from the subtraction code latch 148, and receive the first and second control pulses CNTP1 and CNTP2 from the control pulse generation circuit (111 of FIG. 3). The code selector 149 may generate the voltage control code VCD from the addition voltage control code AVCD and the subtraction voltage control code SVCD on the basis of the first and second control pulses CNTP1 and CNTP2. The code selector 149 may select and output the addition voltage control code AVCD as the voltage control code VCD when the first control pulse CNTP1 is generated, and select and output the subtraction voltage control code SVCD as the voltage control code VCD when the second control pulse CNTP2 is generated. The code selector 149 may feed the voltage control code VCD back to the voltage control code latch 141.

Figure 5:
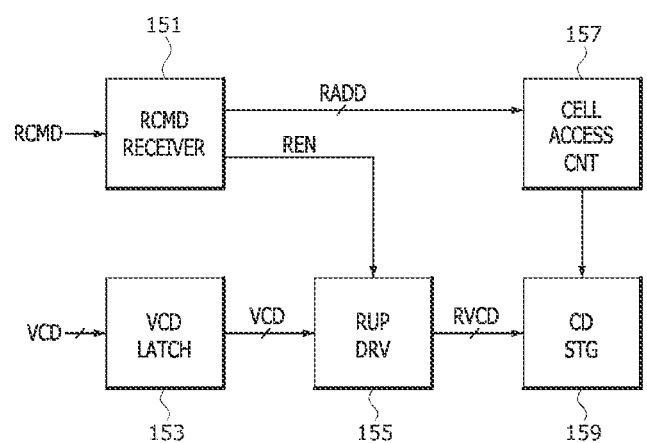
FIG. 5 is a block diagram illustrating a configuration of a rupture control circuit included in the electronic device in accordance with the present embodiment.

FIG. 5 is a block diagram illustrating a configuration of the rupture control circuit 119. As illustrated in FIG. 5, the rupture control circuit 119 may include a rupture command receiver (RCMD RECEIVER) 151, a voltage control code latch (VCD LATCH) 153, a rupture driver (RUP DRV) 155, a cell access control circuit (CELL ACCESS CNT) 157 and a code storage circuit (CD STG) 159.

The rupture command receiver 151 may receive the rupture command (RCMD of FIG. 2) from the command decoder (110 of FIG. 2). The rupture command receiver 151 may generate a rupture address RADD and a rupture enable signal REN on the basis of the rupture command RCMD. The rupture command receiver 151 may generate the rupture address RADD and the rupture enable signal REN when the rupture command RCMD is generated for a rupture operation. The rupture address RADD may include information for accessing a storage region in which the voltage control code VCD is stored during the rupture operation, among storage regions included in the code storage circuit 159. The rupture address RADD may be implemented to include various numbers of bits. The rupture enable signal REN may be enabled to drive the voltage control code VCD to apply a rupture voltage control code RVCD to the code storage circuit 159, when the rupture operation is performed.

The voltage control code latch 153 may receive and latch the voltage control code VCD, and output the latched voltage control code VCD. The voltage control code latch 153 is illustrated as a separate circuit from the voltage control code latch 141 illustrated in FIG. 4. In an embodiment, however, the voltage control code latch 153 and the voltage control code latch 141 may be implemented as one circuit.

The rupture driver 155 may be coupled to the rupture command receiver 151, and receive the rupture enable signal REN from the rupture command receiver 151. When the rupture enable signal REN is enabled to perform the rupture operation, the rupture driver 155 may drive the voltage control code VCD to generate the rupture voltage control code RVCD, and apply the rupture voltage control code RVCD to the code storage circuit 159.

The cell access control circuit 157 may be coupled to the rupture command receiver 151, and receive the rupture address RADD from the rupture command receiver 151. The cell access control circuit 157 may access a storage region in which the voltage control code VCD is stored by the rupture address RADD, among the storage regions included in the code storage circuit 159, when the rupture operation is performed.

The code storage circuit 159 may store the rupture voltage control code RVCD, driven by the rupture driver 155, in the storage region which is accessed by the rupture address RADD when the rupture operation is performed. The code storage circuit 159 may be implemented as an ARE (ARray E-fuse) to store the voltage control code VCD.

FIGS. 6 to 10 are flowcharts for describing the process in which the operation voltage V_OP is generated in the electronic device 13A in accordance with the present embodiment.

Figure 6:
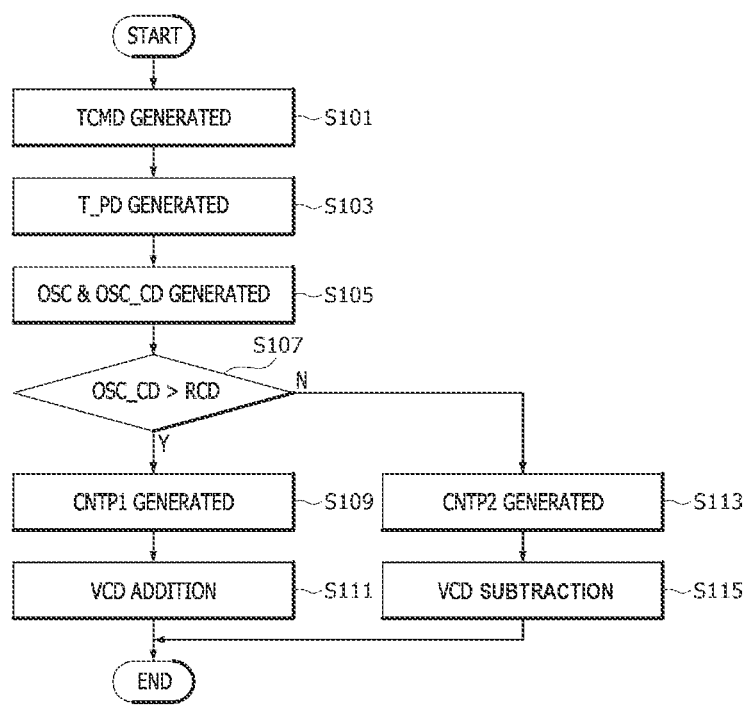
FIGS. 6, 7, 8, 9, and 10 are flowcharts for describing a process in which an operation voltage is generated in the electronic system in accordance with the present embodiment.

As illustrated in FIG. 6, when the test command TCMD is generated for a test in step S101, the test period signal T_PD which is enabled during the test period may be generated in step S103. During the test period, the oscillating signal OSC may be generated, and the oscillating code OSC_CD having a logic bit set corresponding to a count value obtained by counting the oscillating signal OSC may be generated in step S105. The voltage control code VCD may be controlled through addition or subtraction according to the comparison result between the oscillating code OSC_CD and the reference code RCD, in steps S107, S109, S111, S113 and S115.

Figure 7:
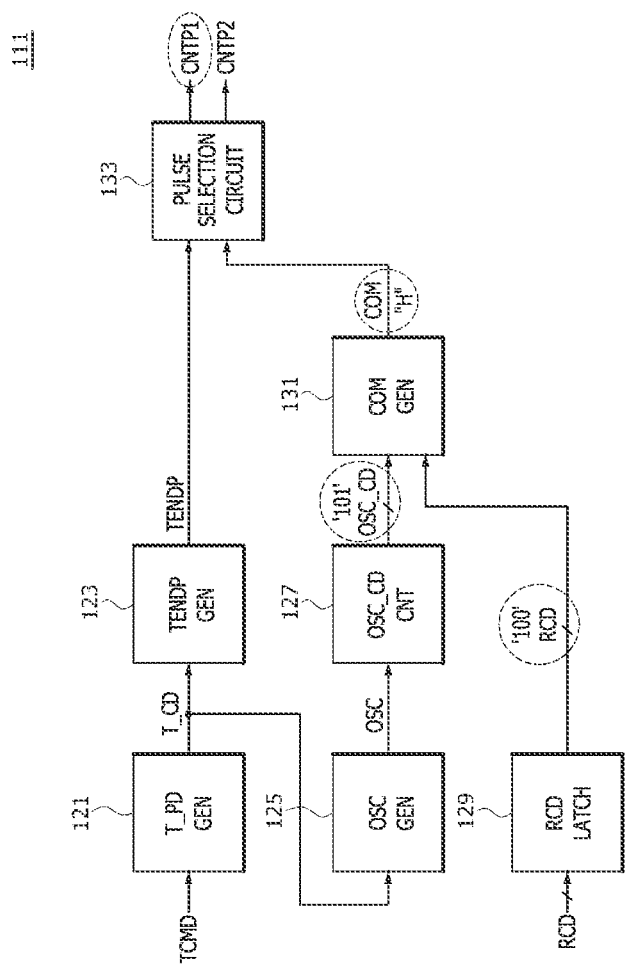

As illustrated in FIGS. 6 and 7, when the logic bit set of the oscillating code OSC_CD is generated as '101' with the logic bit set of the reference code RCD set to '100', the comparison signal COM may be generated as a logic high level 'H', because the oscillating code OSC_CD is larger than the reference code RCD, in step S107. When the comparison signal COM is generated as the logic high level, the first control pulse CNTP1 may be generated from the test end pulse TENDP in step S109.

Figure 8:
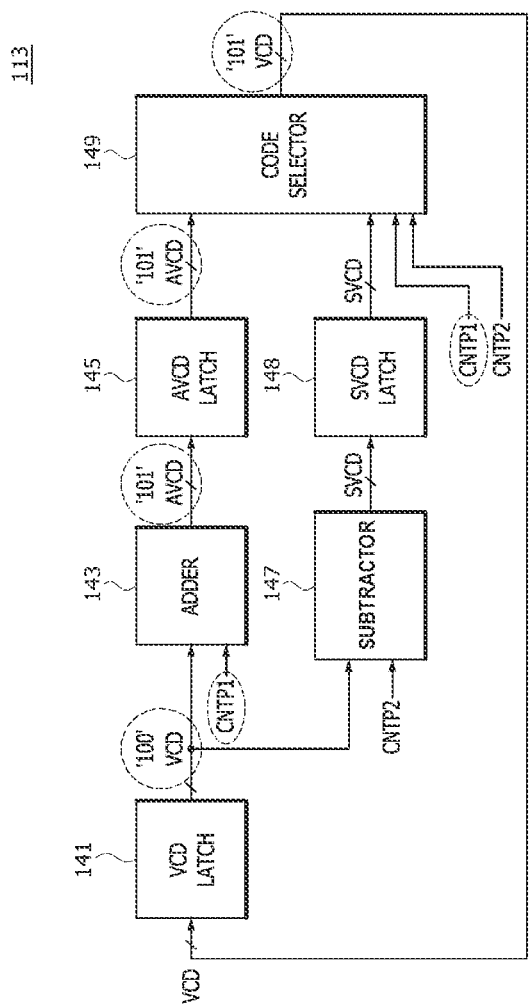

As illustrated in FIGS. 6 and 8, when the first control pulse CNTP1 is generated, the addition voltage control code AVCD having a logic bit set of '101' may be generated by adding one bit to the voltage control code VCD set to '100', and selected and output as the voltage control code VCD. Thus, the logic bit set of the voltage control code VCD may be controlled to '101' in step S111. In an embodiment, when the first control pulse CNTP1 is generated, the addition voltage control code AVCD having a logic bit set of '101' may be generated through an addition operation by adding one bit to the voltage control code VCD set to '100', and selected and output as the voltage control code VCD.

Figure 9:
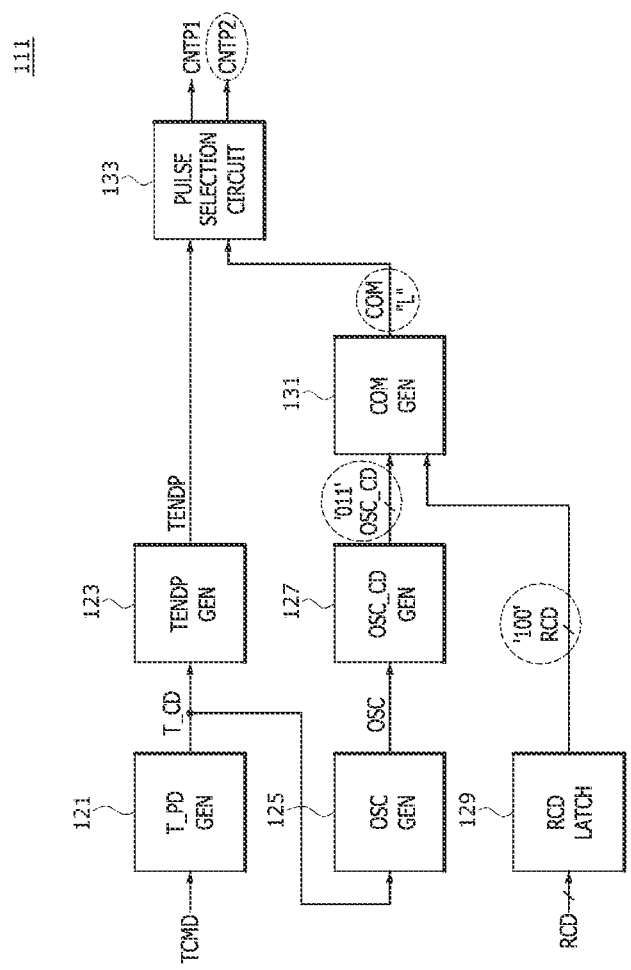

As illustrated in FIGS. 6 and 9, when the logic bit set of the oscillating code OSC_CD is generated as '011' with the logic bit set of the reference code RCD set to '100', the comparison signal COM may be generated as a logic low level 'L', because the oscillating code OSC_CD is smaller than the reference code RCD, in step S107. When the comparison signal COM is generated as the logic low level, the second control pulse CNTP2 may be generated from the test end pulse TENDP in step S113.

Figure 10:
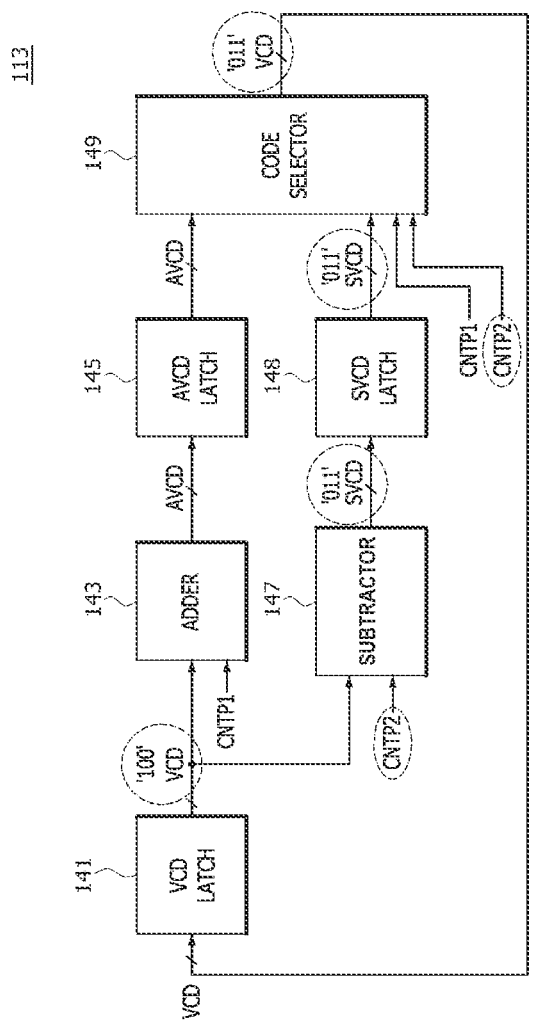

As illustrated in FIGS. 6 and 10, when the second control pulse CNTP2 is generated, the subtraction voltage control code SVCD having a logic bit set of '011' may be generated by subtracting one bit from the voltage control code VCD set to '100', and selected and output as the voltage control code VCD. Thus, the logic bit set of the voltage control code VCD may be controlled to '011' in step S115. In an embodiment, when the second control pulse CNTP2 is generated, the subtraction voltage control code SVCD having a logic bit set of '011' may be generated by a subtraction operation by subtracting one bit from the voltage control code VCD set to '100', and selected and output as the voltage control code VCD.

The electronic system 1 in accordance with the present embodiment may generate the voltage control code VCD having a logic bit set that is controlled on the basis of the comparison result between the oscillating code OSC_CD generated during the test period and the reference code RCD generated in response to the target level, and repeatedly perform the test of controlling the voltage level of the operation voltage V_OP on the basis of the target level according to the voltage control code VCD, thereby setting the voltage level of the operation voltage V_OP to the target level. The electronic system 1 in accordance with the present embodiment may check the stored voltage control code VCD by performing the rupture operation of storing the voltage control code VCD generated on the basis of the comparison result between the oscillating code OSC_CD and the reference code RCD, thereby checking the level of the operation voltage. In the electronic system 1 in accordance with the present embodiment, the test of controlling the voltage level of the operation voltage V_OP on the basis of the target level according to the voltage control code VCD may be performed by a plurality of electronic devices using the operation voltage V_OP, which makes it possible to minimize the voltage level difference between the operation voltages V_OP generated by the plurality of electronic devices. The electronic system 1 in accordance with the present embodiment may repeatedly perform the test of controlling the level of the operation voltage V_OP without repeatedly receiving the reference code RCD during each test, thereby reducing the test time.

Figure 11:
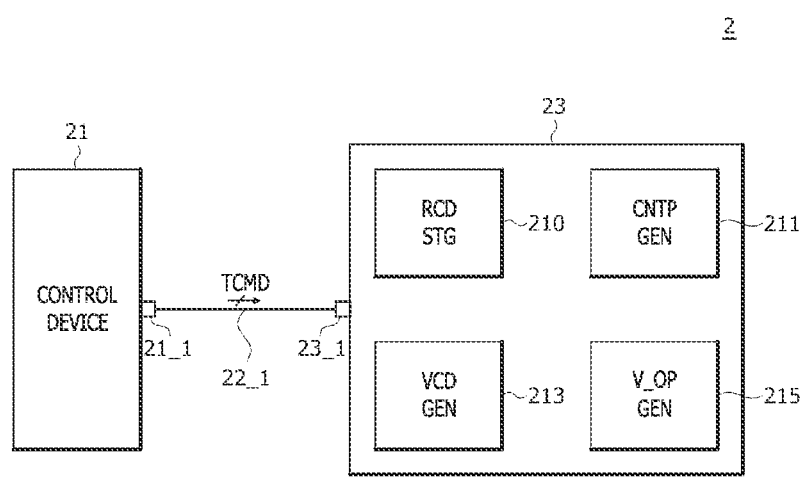
FIG. 11 is a block diagram illustrating a configuration of an electronic system in accordance with another embodiment.

FIG. 11 is a block diagram illustrating a configuration of an electronic system 2 in accordance with another embodiment. As illustrated in FIG. 11, the electronic system 2 may include a control device 21 and an electronic device 23.

The control device 21 may include a control pin 21_1. The electronic device 23 may include a device pin 23_1. The control device 21 may transmit a test command TCMD to the electronic device 23 through a transmission line 22_1 coupled between the control pin 21_1 and the device pin 23_1, the test command TCMD being generated to perform a test. The control pin 21_1, the transmission line 22_1 and the device pin 23_1 may be each implemented as a plurality of pins or lines according to the number of bits contained in the test command TCMD.

The electronic device 23 may receive the test command TCMD from the control device 21, and perform a test for setting the voltage level of an operation voltage (V_OP of FIG. 12) to a target level. The electronic device 23 may include a reference code storage circuit (RCD_STG) 210 configured to store the reference code RCD, and output the reference code RCD having a logic bit set corresponding to the target level during a test period. The electronic device 23 may include a control pulse generation circuit 211 configured to generate one of a first control pulse (CNTP1 of FIG. 12) and a second control pulse (CNTP2 of FIG. 12) on the basis of the reference code RCD during the test period. The electronic device 23 may include a voltage control code generation circuit 213 configured to control the logic bit set of a voltage control code (VCD of FIG. 12) by performing addition or subtraction on the voltage control code VCD on the basis of the first control pulse CNTP1 and the second control pulse CNTP2. The electronic device 23 may include an operation voltage generation circuit 215 configured to drive the operation voltage V_OP to a voltage level corresponding to the logic bit set of the voltage control code VCD.

Figure 12:
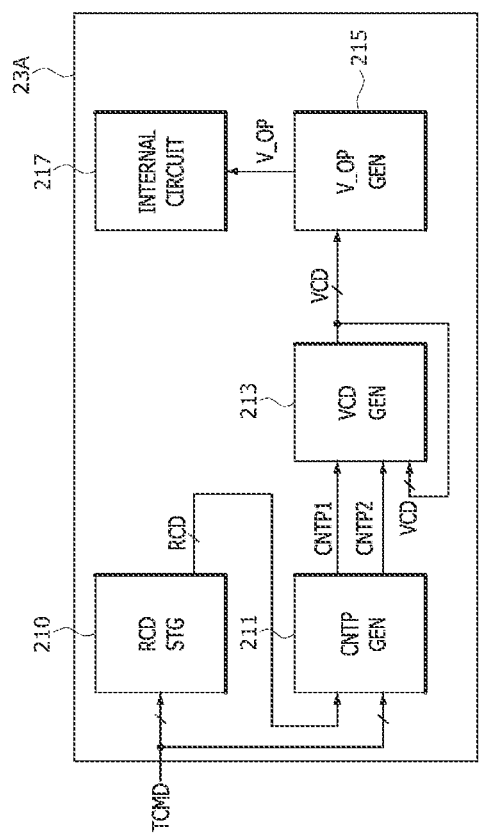
FIG. 12 is a block diagram illustrating a configuration of an electronic device included in the electronic system in accordance with another embodiment.

FIG. 12 is a block diagram illustrating a configuration of an electronic device 23A. As illustrated in FIG. 12, the electronic device 23A may include a reference code storage circuit (RCD_STG) 210, a control pulse generation circuit (CNTP GEN) 211, a voltage control code generation circuit (VCD GEN) 213, an operation voltage generation circuit (V_OP GEN) 215 and an internal circuit 217.

The reference code storage circuit 210 may be implemented as an ARE (ARray E-fuse) to store the reference code RCD. The reference code storage circuit 210 may receive the test command TCMD from the control device 21 illustrated in FIG. 11. The reference code storage circuit 210 may output the reference code RCD having a logic bit set corresponding to the target level, during the test period.

The control pulse generation circuit 211 may be coupled to the reference code storage circuit 210 and the control device (21 of FIG. 11). The control pulse generation circuit 211 may receive the reference code RCD from the reference code storage circuit 210, and receive the test command TCMD from the control device 21 illustrated in FIG. 11. The control pulse generation circuit 211 may generate the first control pulse CNTP1 and the second control pulse CNTP2 on the basis of the test command TCMD and the reference code RCD. Since the control pulse generation circuit 211 may be implemented in the same manner as the control pulse generation circuit 111 illustrated in FIG. 3, the detailed descriptions of the configuration and operation thereof will be omitted herein.

The voltage control code generation circuit 213 may be coupled to the control pulse generation circuit 211, and receive the first and second control pulses CNTP1 and CNTP2 from the control pulse generation circuit 211. The voltage control code generation circuit 213 may control the logic bit set of the voltage control code VCD by performing addition or subtraction on the voltage control code VCD on the basis of the first and second control pulses CNTP1 and CNTP2. Since the voltage control code generation circuit 213 may be implemented in the same manner as the voltage control code generation circuit 113 illustrated in FIG. 4, the detailed descriptions of the configuration and operation thereof will be omitted herein.

The operation voltage generation circuit 215 may be coupled to the voltage control code generation circuit 213, and receive the voltage control code VCD from the voltage control code generation circuit 213. The operation voltage generation circuit 215 may drive the operation voltage V_OP to a voltage level corresponding to the logic bit set of the voltage control code VCD.

The internal circuit 217 may be coupled to the operation voltage generation circuit 215, and receive the operation voltage V_OP from the operation voltage generation circuit 215. The internal circuit 217 may receive the operation voltage V_OP having a voltage level that is controlled on the basis of the reference code RCD, and perform various internal operations. The operation voltage V_OP may be controlled to the target level corresponding to the reference code RCD, as tests are repeated.

Figure 13:
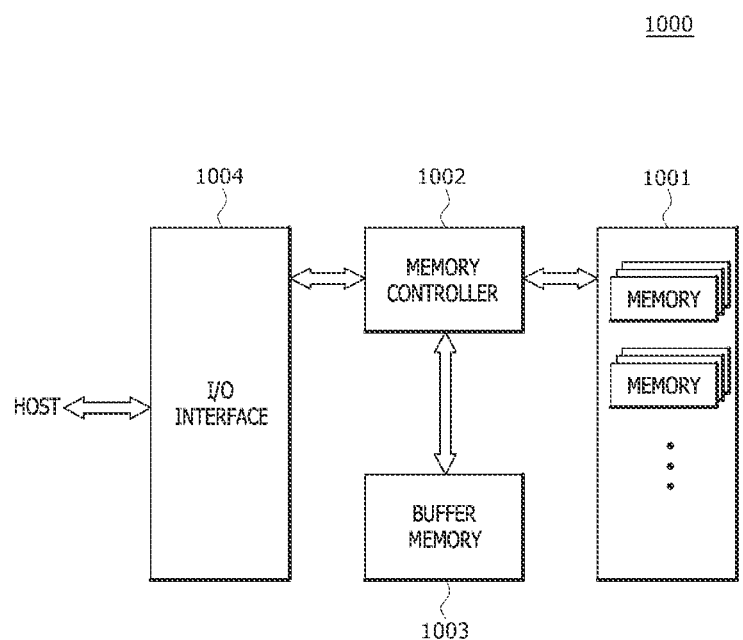
FIG. 13 is a diagram illustrating a configuration of an electronic system in accordance with still another embodiment.

FIG. 13 is a diagram illustrating a configuration of an electronic system 1000 in accordance with still another embodiment. As illustrated in FIG. 13, the electronic system 1000 in accordance with the present embodiment may include a data storage unit 1001, a memory controller 1002, a buffer memory 1003 and an input/output interface 1004.

According to a control signal from the memory controller 1002, the data storage unit 1001 stores data applied from the memory controller 1002, reads the stored data, and outputs the read data to the memory controller 1002. The data storage unit 1001 may include a package module. The package module may include a plurality of chips. The data storage unit 1001 may include a nonvolatile memory capable of continuously retaining data stored therein even though power is removed. The nonvolatile memory may be implemented as a flash memory (NOR flash memory or NAND flash memory), PRAM (Phase Change Random Access Memory), RRAM (Resistive Random Access Memory), STTRAM (Spin Transfer Torque Random Access Memory) or MRAM (Magnetic Random Access Memory). The data storage unit 1001 may generate an operation voltage V_OP set to the target level, and perform various internal operations. The data storage unit 1001 may perform a test for setting the voltage level of the operation voltage V_OP to the target level.

The memory controller 1002 decodes a command applied from an external device (host device) through the input/output interface 1004, and controls data input/output on the data storage unit 1001 and the buffer memory 1003 according to the decoding result. FIG. 13 illustrates the memory controller 1002 as one block. However, the memory controller 1002 may include a controller for controlling the data storage unit 1001 and a controller for controlling the buffer memory 1003 as a volatile memory, which are independently configured.

The buffer memory 1003 may temporarily store data to be processed by the memory controller 1002, i.e. data inputted to/output from the data storage unit 1001. The buffer memory 1003 may store data DATA applied from the memory controller 1002 according to a control signal. The buffer memory 1003 reads the data stored therein and outputs the read data to the memory controller 1002. The buffer memory 1003 may include a volatile memory such as DRAM (Dynamic Random Access Memory), mobile DRAM and SRAM (Static Random Access Memory). The buffer memory 1003 may generate an operation voltage V_OP set to the target level, and perform various internal operations. The buffer memory 1003 may perform a test for setting the voltage level of the operation voltage V_OP to the target level.

The input/output interface 1004 may provide a physical connection between the memory controller 1002 and an external device (host), such that the memory controller 1002 can receive the control signal for data input/output from the external device and exchange data with the external device. The input/output interface 1004 may include one of various interface protocols such as USB, MMC, PCI-E, SAS, SATA, PATA, SCSI, ESDI and IDE.

The electronic system 1000 may be used as a secondary memory device or external storage device of the host device. The examples of the electronic system 1000 may include an SSD (Solid State Disk), a USB (Universal Serial Bus) memory, an SD (Secure Digital) card, an mSD (mini Secure Digital) card, a micro SD card, an SDHC (Secure Digital High Capacity) card, a memory stick card, an SM (Smart Media) card, an MMC (Multi-Media Card), an eMMC (embedded MMC), a CF (Compact Flash) card and the like.

The embodiments of the present disclosure have been disclosed above for illustrative purposes. Those skilled in the art will appreciate that various modifications, additions and substitutions are possible, without departing from the scope and spirit of the disclosure as disclosed in the accompanying claims.

What is claimed is:

1. An electronic device comprising:
a control pulse generation circuit configured to selectively generate one of a first control pulse and a second control pulse on the basis of a reference code during a test period; and
a voltage control code generation circuit configured to perform at least one of an addition operation and a subtraction operation on a logic bit set of a voltage control code to set a voltage level of an operation voltage on the basis of the first and second control pulses,
wherein the control pulse generation circuit generates an oscillating code by counting an oscillating signal generated during the test period, and selectively generates one of the first and second control pulses according to a comparison result between the oscillating code and the reference code.

2. The electronic device of claim 1, wherein the control pulse generation circuit receives the reference code corresponding to a target level of the operation voltage externally from the electronic device.

3. The electronic device of claim 1, further comprising a reference code storage circuit configured to store the reference code corresponding to a target level of the operation voltage, and output the reference code during the test period, wherein the control pulse generation circuit receives the reference code from the reference code storage circuit.

4. The electronic device of claim 1, wherein the control pulse generation circuit comprises:
an oscillating signal generation circuit configured to generate an oscillating signal on the basis of a test period signal;
an oscillating code generation circuit configured to generate an oscillating code by counting the oscillating signal;
a comparison signal generation circuit configured to generate a comparison signal according to a comparison result between the oscillating code and the reference code; and
a pulse selection circuit configured to selectively generate one of the first and second control pulses on the basis of the comparison signal and a test end pulse.

5. The electronic device of claim 4, wherein the oscillating signal generation circuit receives the test period signal which is enabled during the test period.

6. The electronic device of claim 4, wherein the pulse selection circuit generates the first control pulse from the test end pulse when a logic bit set of the oscillating code is larger than a logic bit set of the reference code, and generates the second control pulse from the test end pulse when a logic bit set of the oscillating code is smaller than or equal to the logic bit set of the reference code.

7. The electronic device of claim 4, wherein the pulse selection circuit receives the test end pulse which is generated at a point of time that the test period is ended.

8. The electronic device of claim 1, wherein the voltage control code generation circuit comprises an adder,
wherein the adder is configured to generate an addition voltage control code by performing addition on the logic bit set of the voltage control code when the first control pulse is generated.

9. The electronic device of claim 8, wherein the voltage control code generation circuit further comprises a subtractor,
wherein the subtractor is configured to generate a subtraction voltage control code by performing subtraction on the logic bit set of the voltage control code when the second control pulse is generated.

10. The electronic device of claim 9, wherein the voltage control code generation circuit further comprises a code selector,
wherein the code selector is configured to select the addition voltage control code as the voltage control code on the basis of the first control pulse, and to select the subtraction voltage control code as the voltage control code on the basis of the second control pulse.

11. The electronic device of claim 1, further comprising a rupture control circuit configured to perform a rupture operation of storing the voltage control code in a code storage circuit.

12. The electronic device of claim 11, wherein the rupture control circuit comprises:
a rupture command receiver configured to generate a rupture address and a rupture enable signal on the basis of a rupture command;
a rupture driver configured to drive the voltage control code to generate a rupture voltage control code on the basis of the rupture enable signal, and apply the rupture voltage control code in order to store the voltage control code in the code storage circuit; and
a cell access control circuit configured to access at least one storage region of storage regions included in the code storage circuit, based on the rupture address.

13. The electronic device of claim 1, further comprising an operation voltage generation circuit configured to generate the operation voltage on the basis of the voltage control code.

14. An electronic system comprising:
a control device configured to generate a command and a reference code; and
an electronic device configured to generate a test command for a test on the basis of the command, and perform at least one of an addition operation and a subtraction operation on a logic bit set of a voltage control code to set a voltage level of an operation voltage on the basis of the reference code during a test period in which the test is performed, wherein the electronic device comprises a control pulse generation circuit configured to selectively generate one of a first control pulse and a second control pulse on the basis of the reference code during the test period, and wherein the control pulse generation circuit generates an oscillating code by counting an oscillating signal generated during the test period, and selectively generates one of the first and second control pulses according to a comparison result between the oscillating code and the reference code.

15. The electronic system of claim 14, wherein the electronic device further comprises:

a voltage control code generation circuit configured to control the logic bit set of the voltage control code on the basis of the first and second control pulses.

16. The electronic system of claim 15, wherein the voltage control code generation circuit comprises:

an adder configured to generate an addition voltage control code by performing addition on the logic bit set of the voltage control code when the first control pulse is generated;

a subtractor configured to generate a subtraction voltage control code by performing subtraction on the logic bit set of the voltage control code when the second control pulse is generated; and a code selector configured to output, as the voltage control code, one of the addition voltage control code and the subtraction voltage control code on the basis of the first and second control pulses.

17. The electronic system of claim 15, wherein the electronic device further comprises:

a rupture control circuit configured to perform a rupture operation of storing the voltage control code in a code storage circuit; and an operation voltage generation circuit configured to generate the operation voltage on the basis of the voltage control code.

18. An electronic system comprising:

a control device configured to generate a command; and an electronic device configured to generate a test command for a test on the basis of the command, store a reference code in the electronic device, and perform at least one of an addition operation and a subtraction operation on a logic bit set of a voltage control code to set a voltage level of an operation voltage on the basis of the reference code during a test period in which the test is performed, wherein the electronic device comprises a control pulse generation circuit configured to selectively generate one of a first control pulse and a second control pulse on the basis of the reference code during the test period, and wherein the control pulse generation circuit generates an oscillating code by counting an oscillating signal generated during the test period, and selectively generates one of the first and second control pulses according to a comparison result between the oscillating code and the reference code.

* * * * *